United States Patent
Zhu et al.

(10) Patent No.: US 7,869,841 B2
(45) Date of Patent: *Jan. 11, 2011

(54) TELEPHONE SYSTEM HAVING REDUCED SENSITIVITY TO RF INTERFERENCE AND RELATED METHODS

(75) Inventors: Lizhong Zhu, Waterloo (CA); Michael Corrigan, Waterloo (CA); George Mankaruse, Kitchener (CA); Perry Jarmuszewski, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 121 days.

This patent is subject to a terminal disclaimer.

(21) Appl. No.: 12/326,212

(22) Filed: Dec. 2, 2008

(65) Prior Publication Data

US 2009/0080643 A1 Mar. 26, 2009

Related U.S. Application Data

(63) Continuation of application No. 11/343,091, filed on Jan. 30, 2006, now Pat. No. 7,480,523.

(51) Int. Cl.
*H04M 1/00* (2006.01)
*H04B 17/00* (2006.01)

(52) U.S. Cl. ............... 455/575.1; 455/67.13; 455/63.1; 379/167.15

(58) Field of Classification Search ............ None
See application file for complete search history.

(56) References Cited

U.S. PATENT DOCUMENTS

| 6,473,495 | B1 | 10/2002 | Willer | 379/90.01 |
| 7,072,476 | B2 | 7/2006 | White et al. | 381/74 |
| 7,480,523 | B2 * | 1/2009 | Zhu et al. | 455/575.1 |
| 2006/0039454 | A1 | 2/2006 | Cioffi | 375/222 |

* cited by examiner

*Primary Examiner*—Erika A Gary
(74) *Attorney, Agent, or Firm*—Allen, Dyer, Doppelt, Milbrath & Gilchrist, P.A.

(57) ABSTRACT

A telephone to be connected to a wireline having reduced sensitivity to RF interference over a predetermined frequency range from an adjacent mobile wireless communications device may include a transmit amplifier, a receive amplifier, an audio input transducer connected to the transmit amplifier, and an audio output transducer connected to the receive amplifier. The telephone may further include an RF shield(s) surrounding the audio input transducer and the audio output transducer for reducing RF interference over the predetermined frequency range from the adjacent mobile wireless communications device. Moreover, the telephone may also include at least one RF audio input filter element connected to the audio input transducer and at least one RF audio output filter element connected to the audio output transducer, both of which are also for reducing RF interference over the predetermined frequency range from the adjacent mobile wireless communications device.

28 Claims, 4 Drawing Sheets

TELEPHONE SYSTEM HAVING REDUCED SENSITIVITY TO RF INTERFERENCE AND RELATED METHODS

This application is a continuation of Ser. No. 11/343,091 now U.S. Pat. No. 7,480,523, filed Jan. 30, 2006, the entire disclosure of which is hereby incorporated herein by reference.

FIELD OF THE INVENTION

Background of the Invention

Cellular communications systems continue to grow in popularity and have become an integral part of both personal and business communications. Cellular telephones allow users to place and receive voice calls most anywhere they travel. Moreover, as cellular telephone technology has increased, so too has the functionality of cellular devices and the different types of devices available to uses. For example, many cellular devices now incorporate personal digital assistant (PDA) features such as calendars, address books, task lists, etc. Moreover, such multi-function devices may also allow users to wirelessly send and receive electronic mail (email) messages and access the Internet via a cellular network and/or a wireless local area network (WLAN), for example.

Accordingly, because of the widespread use and reliance on cellular devices, many users carry their cellular devices on their person much of the day, and place them on their desks at work. Yet, since cellular devices are frequently communicating with a cellular network even when a user is not participating in a phone call, they are frequently emitting radio frequency (RF) signals. When in close proximity to a land line telephone, such as a private branch exchange (PBX) phone in a workplace, these RF signals may cause interference which results in an audible buzz or other undesirable sound by the PBX phone.

Certain PBX telephone devices have generally attempted to address interference from other sources. By way of example, U.S. Pat. No. 6,473,495 to Willer is directed to a home network environment implemented in a customer premises having a PBX for outputting analog telephone signals onto twisted pair wiring arranged in a star topology. This is done by adding a high pass filter in parallel along the twisted pair wiring. The high pass filter enables transmission of network data signals between the telephone line pairs connected to the PBX without interference of the switching operations by the PBX of analog telephone signals. The high pass filter may be implemented within the PBX, or added externally to the PBX system as a retrofit for existing customer premises.

Despite such attempts to address certain interference problems in PBX telephone systems, further protection may be required to significantly mitigate the effects of RF interference from a nearby cellular device, for example.

DETAILED DESCRIPTION OF THE PREFERRED EMBODIMENTS

Figure 1:
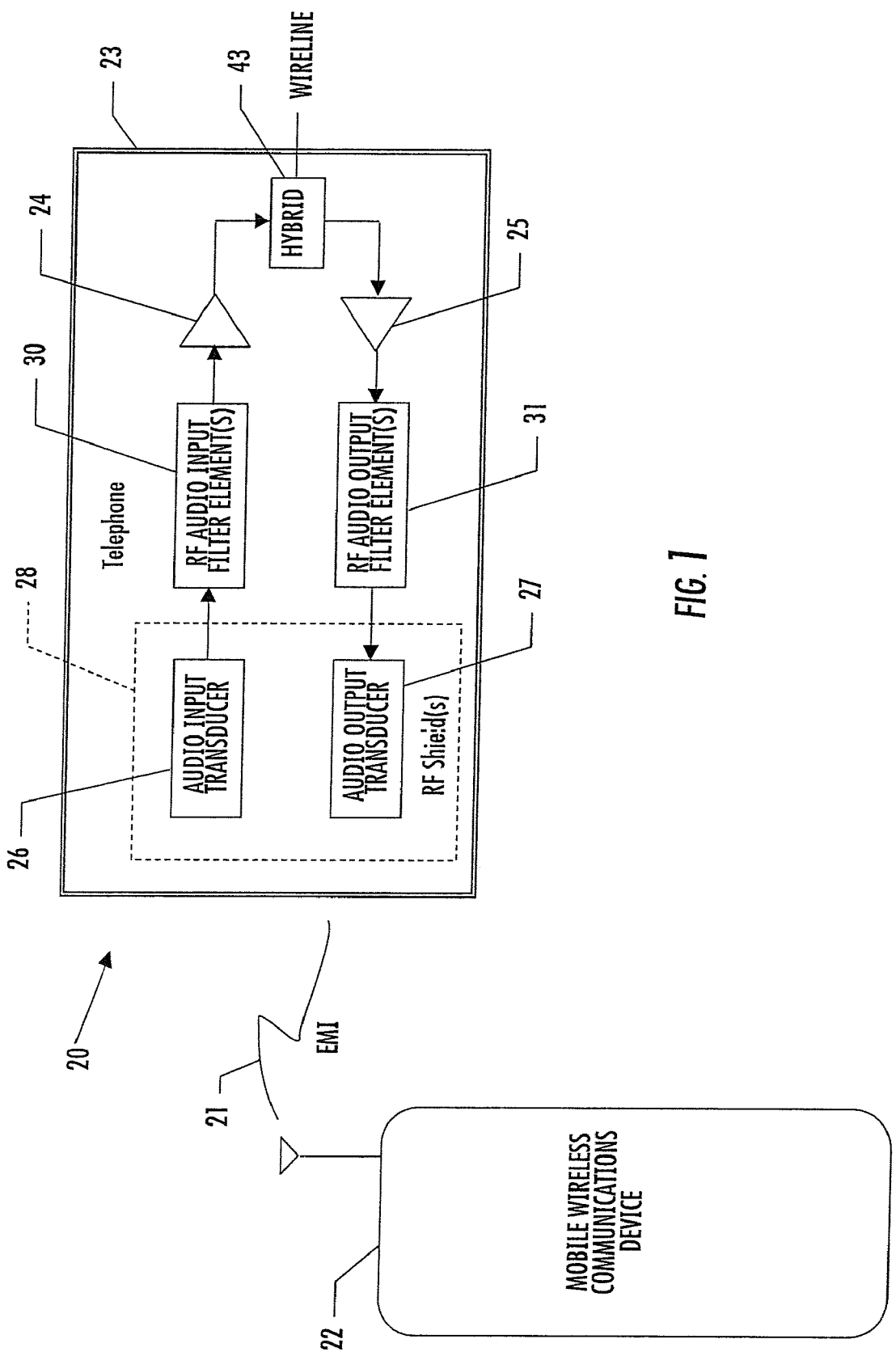
FIG. 1 is a schematic block diagram of a telephone according to the invention having reduced sensitivity to RF interference from an adjacent mobile wireless communications device.

The present description is made with reference to the accompanying drawings, in which preferred embodiments are shown. However, many different embodiments may be used, and thus the description should not be construed as limited to the embodiments set forth herein. Rather, these embodiments are provided so that this disclosure will be thorough and complete. Like numbers refer to like elements throughout, and prime and multiple prime notation are used to indicate similar elements in alternate embodiments.

Generally speaking, a telephone to be connected to a wireline is disclosed herein having reduced sensitivity to RF interference over a predetermined frequency range from an adjacent mobile wireless communications device. The telephone may include a transmit amplifier, a receive amplifier, an audio input transducer connected to the transmit amplifier, and an audio output transducer connected to the receive amplifier. The telephone may further include at least one RF shield surrounding the audio input transducer and the audio output transducer for reducing RF interference over the predetermined frequency range from the adjacent mobile wireless communications device. Moreover, the telephone may also include at least one RF audio input filter element connected to the audio input transducer for reducing RF interference over the predetermined frequency range from the adjacent mobile wireless communications device. In addition, at least one RF audio output filter element may be connected to the audio output transducer for reducing RF interference over the predetermined frequency range from the adjacent mobile wireless communications device.

By way of example, the at least one RF audio input filter element and the at least one RF audio output filter element may each include at least one series connected ferrite bead and at least one parallel connected capacitor and, more particularly, a plurality of series connected ferrite beads and a plurality of parallel connected capacitors. The predetermined frequency range may be from about 30 MHz to 6 GHz, for example. In addition, the telephone may further include a hybrid circuit connected between the transmit and receive amplifiers and the wireline, and a housing carrying the transmit and receive amplifiers.

Furthermore, the at least one RF shield may include a first RF shield for the audio input transducer and a second RF shield for the audio output transducer. The telephone may further include an analog to digital converter (ADC) connected to the transmitter amplifier, and a digital to analog converter (DAC) connected to the receive amplifier. As such, the at least one RF shield may also surround the ADC and the DAC.

A related method aspect is for reducing sensitivity of a telephone, such as the one described briefly above, to RF interference over a predetermined frequency range from an adjacent mobile wireless communications device. The method may include positioning at least one RF shield to surround the audio input transducer and the audio output transducer for reducing RF interference over the predetermined frequency range from the adjacent mobile wireless communications device. Moreover, at least one RF audio input filter element may be connected to the audio input transducer for reducing RF interference over the predetermined frequency range from the adjacent mobile wireless communications device. The method may further include connecting at least one RF audio output filter element to the audio output transducer for reducing RF interference over the predetermined frequency range from the adjacent mobile wireless communications device.

Referring now more particularly to FIG. 1, a telephone 20, such as a PBX telephone, for example, to be connected to a wireline or PBX system has reduced sensitivity to RF interference from RF electromagnetic (EM) energy 21 from an adjacent mobile wireless communications device 22. In particular, the RF signals transmitted by the mobile wireless communications device 22 are within one or more predetermined frequency ranges or bands, as will be appreciated by those skilled in the art. By way of example, the mobile wireless communications device 22 may be a cellular communications device, a WLAN device, a personal area network (PAN) device, etc. Transmissions from the mobile wireless communications device 22 can cause interference at the telephone 20 that results in undesirable audible noises, such as buzzing, for example. As will be described further below, the telephone 20 advantageously includes RF filter elements and an RF shield(s) to reduce the sensitivity of the device to such close-proximity RF interference from the EM energy 21 emanating from the mobile wireless communications device 22.

The telephone 22 illustratively includes a housing 23, a transmit amplifier 24, a receive amplifier 25, an audio input transducer (e.g., a microphone) 26 connected to the transmit amplifier, and an audio output transducer (e.g., a speaker) 27 connected to the receive amplifier. Moreover, a hybrid circuit 43 selectively connects the transmit amplifier 24 and the receive amplifier 25 to the wireline, as will be appreciated by those skilled in the art.

It should be noted that in the illustrated embodiment the above-noted components are shown within a single housing 23, but in some embodiments more than one housing may be used. For example, a base housing may be connected to the wireline, and a handset housing may be connected to the base housing via a wired or wireless communications link, as will be appreciated by those skilled in the art. As such, different components may be located in different housings in different embodiments, as will also be appreciated by those skilled in the art. By way of example, a single housing may be appropriate for a "conference room" style speaker phone for multiple users, and the base/handset version may be appropriate for a personal desktop telephone embodiment. Of course, some phones may have similar components in both the base and the handset, e.g., a desktop phone that includes speakerphone capabilities.

The telephone 20 also illustratively includes one or more RF shields 28 surrounding the audio input transducer 26 and the audio output transducer 27 for advantageously reducing RF interference over the predetermined frequency range from the adjacent mobile wireless communications device 22. Moreover, the telephone 20 further illustratively includes one or more RF audio input filter elements 30 connected to the audio input transducer 26, and one or more RF audio output filter elements 31 connected to the audio output transducer 27, both of which are for reducing RF interference over the predetermined frequency range from the adjacent mobile wireless communications device 22. By way of example, the predetermined frequency range may be from about 30 MHz to 6 GHz, for a cellular communications device, for example.

Figure 2:
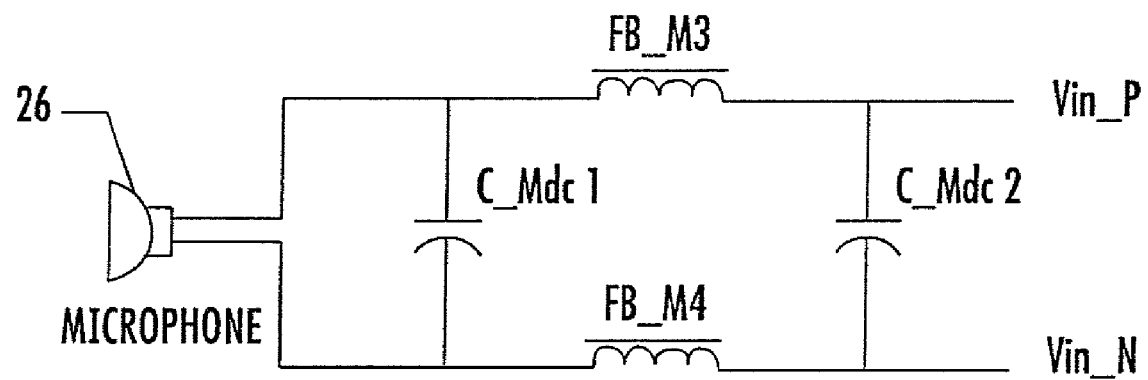
FIG. 2 is a schematic circuit diagram of the audio input transducer and associated filter elements of the telephone of FIG. 1.

Turning more particularly to FIG. 2, an exemplary implementation of RF audio input filter elements illustratively includes a first ferrite bead FB_M3 connected in series between the microphone 26 and a high differential voltage connection Vin_P, and a second ferrite bead FB_M4 connected in series between the microphone 26 and a low differential voltage connection Vin_N. Moreover, capacitors C_Mdc1 and C_Mdc2 are connected in parallel with the microphone 26 and are respectively positioned on the microphone side and the differential input connection side of the ferrite beads FB_M3, FB_M4 as shown in FIG. 2. By way of example, for filtering RF interference in the above-noted frequency range, the ferrite beads FB_M3 and FB_M4 may be Murata BLM15HD182SN1 and BLM15HD182SN1 filters, and the capacitors C_Mdc1 and C_Mdc2 may be 33 pF, for example, respectively. Of course, other values and filter element components/configurations may be used in different embodiments depending upon the particular frequency range to be filtered, the types of circuit components used in the telephone 20, etc., as will be appreciated by those skilled in the art.

Figure 3:
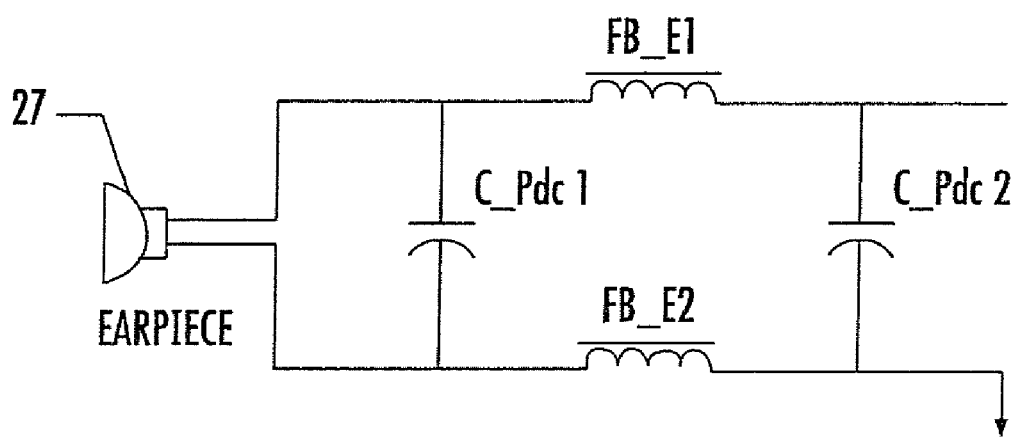
FIG. 3 is a schematic circuit diagram of the audio output transducer and associated filter elements of the telephone of FIG. 1.

Referring additionally to FIG. 3, the RF audio output filter elements may include a first ferrite bead FB_E1 connected in series between the speaker 27 and voltage output connection Vout, and a second ferrite bead FB_E2 connected in series between the speaker 27 and a voltage reference (i.e., ground). Moreover, capacitors C_Pdc1 and C_Pdc2 are connected in parallel with the speaker 27 and are respectively positioned on the speaker side and the voltage output connection Vout side of the ferrite beads FB_E1, FB_E2 as shown in FIG. 3. Again, for filtering RF interference in the above-noted frequency range, exemplary components for the ferrite beads FB_E1 and FB_E2 may be a Murata BLM15HD182SN1 and BLM15HD182SN1, and the capacitors C_Pdc1 and C_Pdc2 may be 33 pF, for example. Again, other values and filter elements/configurations may be used in different embodiments depending upon the particular frequency range to be filtered, the types of circuit components used in the telephone 20, etc., as will be appreciated by those skilled in the art. Moreover, other values and filter element configurations may be used in different embodiments as noted above.

Figure 4:
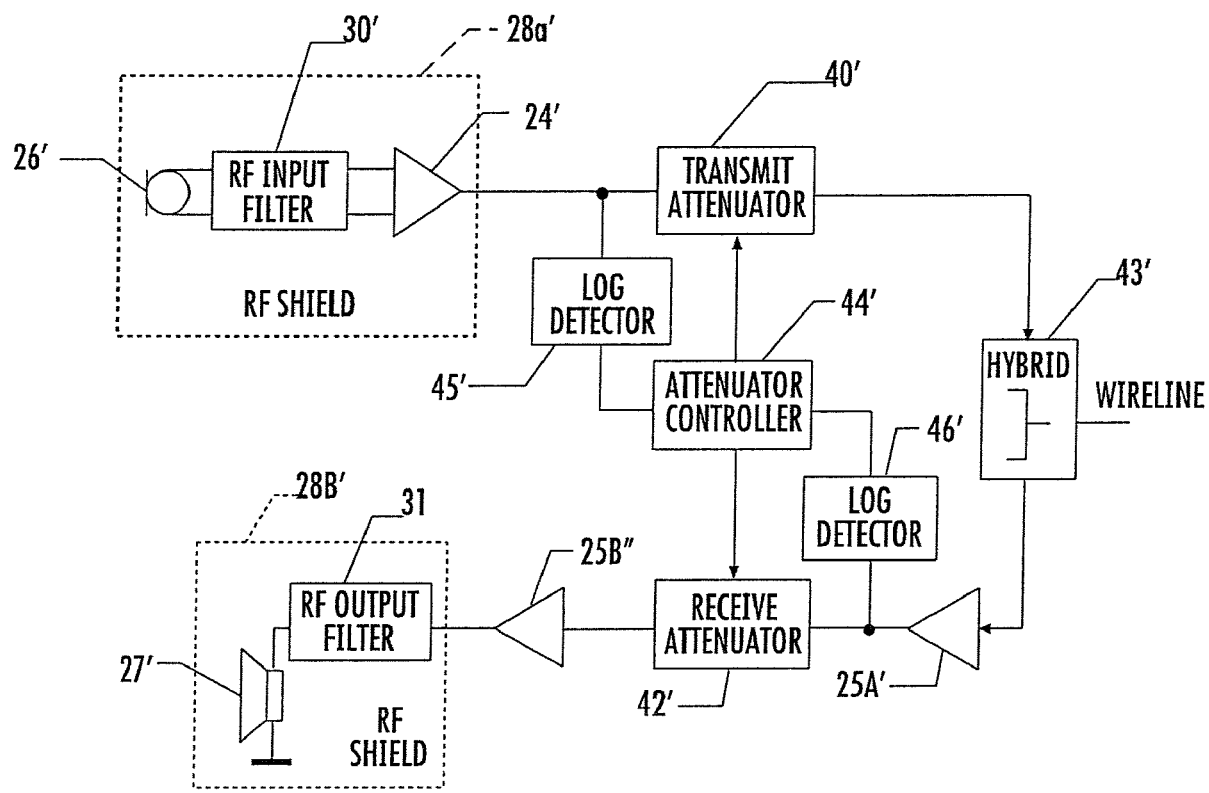
FIG. 4 is a schematic block diagram of an alternate embodiment of the telephone of FIG. 1.

Turning additionally to FIG. 4, another exemplary embodiment of a basic PBX telephone 20' is now described. The telephone 20' illustratively includes a transmit attenuator 40' connected between the transmit amplifier 24' and a hybrid circuit 43'. Moreover, in the illustrated embodiment a pair of receive amplifiers 25a', 25b' are connected between the hybrid circuit 43' and the RF output filter element(s) 31'. A receive attenuator 42' is connected between the output of the receive amplifier 25a' and the input of the receive amplifier 25b', and an attenuator controller 44' is connected to the transmit attenuator 40' and the receive attenuator. In addition, a first logarithmic detector 45' is connected between the output of the transmit amplifier 24' and the attenuator controller 44', and a second logarithmic detector 46' is connected between the output of the receive amplifier 25a' and the attenuator controller, as shown. The functions and operation of the various attenuation components and hybrid circuit 43' will be readily appreciated by those skilled in the art and therefore require no further discussion herein.

Figure 5:
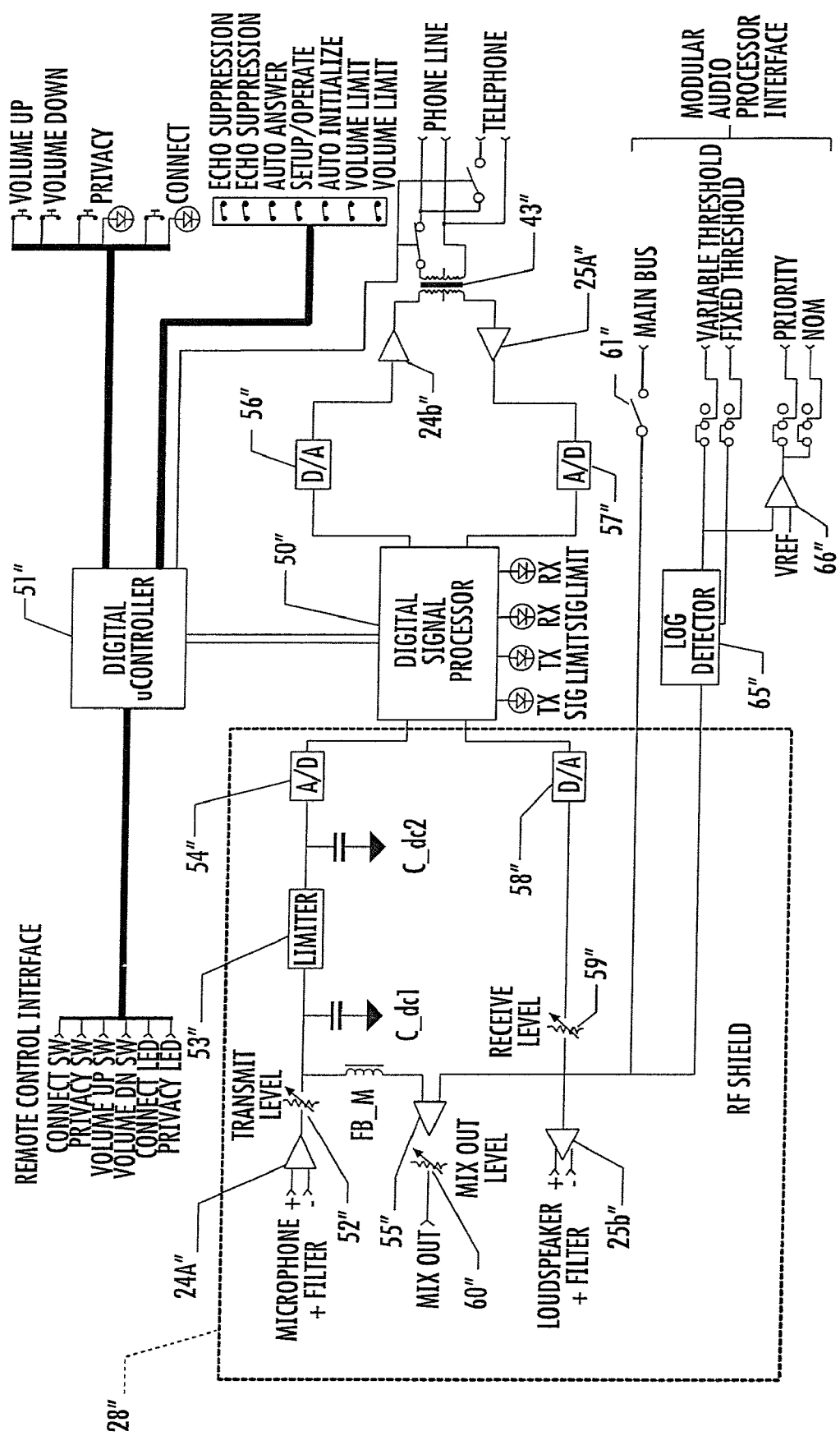
FIG. 5 is a schematic circuit diagram of another alternate embodiment of the telephone of FIG. 1.

Referring now additionally to FIG. 5, another alternate embodiment of a more advanced PBX telephone 20" is described. In this embodiment, much of the phone circuitry is implemented with a digital signal processor 50" and associated digital microcontroller 51" connected thereto. As will be appreciated by those skilled in the art, the digital signal processor 50" and associated digital microcontroller 51" implement various telephone circuit functions, such as those described above and others, based upon software modules designed for the given phone implementation. The digital microcontroller 51" has a plurality of input/outputs (I/Os)

including volume up and down, privacy, connect, echo suppression, auto answering, setup/operate, auto initialize, and volume limit, as will be appreciated by those skilled in the art. The digital microcontroller 51" may also optionally include a remote control interface with connect switch, privacy switch, volume up/down switch, and connect LED and privacy LED inputs, as will also be appreciated by those skilled in the art. The digital signal processor 50" also illustratively has transmit and receive signal and limit I/Os as shown.

The transmit signal path illustratively includes a transmit amplifier 24a" connected to the microphone and associated RF filter, which may be as shown in FIG. 2. A transmit level adjuster 52" is downstream from the transmit amplifier 24a", a limiter 53" is downstream from the transmit level adjuster, and an analog-to-digital (A/D) converter (ADC) 54" is connected between the limiter and the digital signal processor 50". Additional RF filter elements may also be connected in this signal path, including an ferrite bead FB_M connected between the transmit level adjuster and a first input of a mix out amplifier 55", a capacitor C_dc1 connected in parallel with the input of the limiter 53", and a capacitor C_dc2 connected in parallel with the output of the limiter, as shown. Furthermore, a digital-to-analog (D/A) converter (DAC) 56" is connected downstream from the digital signal processor 50", and another transmit amplifier 24b" is downstream from the DAC. The output of the transmit amplifier 24b" is connected to the hybrid circuit 43", which in turn provides switching to the phone line. A separate telephone line may also be included for plugging in peripheral telephone devices (e.g., modems, etc.) to the telephone 20", as will be appreciated by those skilled in the art.

The receive signal path illustratively includes a receive amplifier 25a" downstream from the hybrid circuit 43", and an ADC 57" connected between the audio input amplifier 25a" and the digital signal processor 50". Moreover, a DAC 58" and a receive level adjuster 59" are connected between the digital signal processor 50" and a transmit amplifier 25", which is in turn connected to a loudspeaker and associated RF filter, such as those shown in FIG. 3. It should be noted that in the illustrated embodiment, the transmit level adjuster 52", limiter 53", ADC 54", DAC 58", receive level adjuster 59", mix out amplifier 55", and a mix out level adjuster 60" are advantageously included within the RF shield 28" to provide still further reduction of RF interference from the adjacent mobile wireless communications device 22, as will be appreciated by those skilled in the art.

The telephone may further include a main bus input from a modular audio processor interface and associated switch 61" connected to a second input of the mix out amplifier 60". The input of the audio output amplifier 25b" is also connected to the input of the mix out amplifier 60", as is the output of a log detector circuit 65". The log detector circuit 65" is further connected to variable threshold and fixed threshold references from the modular audio processor interface. A comparator 66" has a first input connected to the variable threshold input of the log detector 65", and a second input connected to a voltage reference VREF as shown. The comparator 66" provides priority and nom signals for the modular audio processor interface, as will be appreciated by those skilled in the art.

A related method aspect is for reducing sensitivity of the telephone 20 to RF interference over a predetermined frequency range from the mobile wireless communications device 22. The method may include positioning at least one RF shield 28 to surround the audio input transducer 26 and the audio output transducer 27 for reducing RF interference over the predetermined frequency range from the adjacent mobile wireless communications device 22. Moreover, at least one RF audio input filter element 30 may be connected to the audio input transducer 26 for reducing RF interference over the predetermined frequency range from the adjacent mobile wireless communications device 22. The method may further include connecting at least one RF audio output filter element 31 to the audio output transducer 27 for reducing RF interference over the predetermined frequency range from the adjacent mobile wireless communications device 22. Additional method aspects will be appreciated by those skilled in the art from the foregoing description and therefore require no further discussion herein.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

That which is claimed is:

1. A telephone to be connected to a wireline comprising:
   a transmit amplifier;
   a receive amplifier;
   an audio input transducer connected to said transmit amplifier;
   an audio output transducer connected to said receive amplifier;
   at least one RF shield surrounding said audio output transducer for reducing RF interference over a frequency range from an adjacent mobile wireless communications device; and
   at least one RF audio output filter element connected to said audio output transducer for reducing RF interference over the frequency range of the adjacent mobile wireless communications device.

2. The telephone of claim 1 wherein said at least one RF audio output filter element comprises at least one series connected ferrite bead.

3. The telephone of claim 1 wherein said at least one RF audio output filter element comprises at least one parallel connected capacitor.

4. The telephone of claim 1 wherein said at least one RF audio output filter element comprises at least one series connected ferrite bead, and at least one parallel connected capacitor.

5. The telephone of claim 1 wherein the frequency range of the adjacent mobile wireless communications device is in a range of 30 MHz to 6 GHz.

6. The telephone of claim 1 further comprising a hybrid circuit to be connected between said transmit and receive amplifiers and the wireline.

7. The telephone of claim 1 further comprising:
   an analog to digital converter (ADC) connected to said transmit amplifier; and
   a digital to analog converter (DAC) connected to said receive amplifier.

8. The telephone of claim 7 wherein said at least one RF shield also surrounds said DAC.

9. The telephone of claim 1 further comprising a housing carrying said transmit and receive amplifiers.

10. A telephone to be connected to a wireline comprising:
   a transmit amplifier;
   a receive amplifier;
   an audio input transducer connected to said transmit amplifier;
   an audio output transducer connected to said receive amplifier;

at least one RF shield surrounding said audio input transducer for reducing RF interference over a frequency range from an adjacent mobile wireless communications device; and at least one RF audio input filter element connected to said audio input transducer for reducing RF interference over the frequency range of the adjacent mobile wireless communications device.

11. The telephone of claim 10 wherein said at least one RF audio input filter element comprises at least one series connected ferrite bead.

12. The telephone of claim 10 wherein said at least one RF audio input filter element comprises and at least one parallel connected capacitor.

13. The telephone of claim 10 wherein said at least one RF audio input filter element comprises at least one series connected ferrite bead, and at least one parallel connected capacitor.

14. The telephone of claim 10 wherein the frequency range of the adjacent mobile wireless communications device is in a range of 30 MHz to 6 GHz.

15. The telephone of claim 10 further comprising a hybrid circuit to be connected between said transmit and receive amplifiers and the wireline.

16. The telephone of claim 10 further comprising:
an analog to digital converter (ADC) connected to said transmit amplifier; and
a digital to analog converter (DAC) connected to said receive amplifier.

17. The telephone of claim 16 wherein said at least one RF shield also surrounds said ADC.

18. The telephone of claim 10 further comprising a housing carrying said transmit and receive amplifiers.

19. A method for reducing sensitivity of a telephone to be connected to a wireline to RF interference over a frequency range from an adjacent mobile wireless communications device, the telephone comprising a transmit amplifier, a receive amplifier, an audio input transducer connected to the transmit amplifier, and an audio output transducer connected to the receive amplifier, the method comprising:
positioning at least one RF shield to surround the audio output transducer for reducing RF interference over the frequency range of the adjacent mobile wireless communications device; and
connecting at least one RF audio output filter element to the audio output transducer for reducing RF interference over the frequency range of the adjacent mobile wireless communications device.

20. The method of claim 19 wherein the at least one RF audio output filter element comprises at least one series connected ferrite bead.

21. The method of claim 19 wherein the at least one RF audio output filter element comprises at least one parallel connected capacitor.

22. The method of claim 19 wherein the frequency range of the adjacent mobile wireless communications device is in a range of 30 MHz to 6 GHz.

23. The method of claim 19 wherein the telephone further comprises a digital to analog converter (DAC) connected to the receive amplifier; and wherein positioning the at least one RF shield comprises positioning the at least one RF shield to also surround the DAC.

24. A method for reducing sensitivity of a telephone to be connected to a wireline to RF interference over a frequency range from an adjacent mobile wireless communications device, the telephone comprising a transmit amplifier, a receive amplifier, an audio input transducer connected to the transmit amplifier, and an audio output transducer connected to the receive amplifier, the method comprising:
positioning at least one RF shield to surround the audio input transducer for reducing RF interference over the frequency range of the adjacent mobile wireless communications device; and
connecting at least one RF audio input filter element to the audio input transducer for reducing RF interference over the frequency range of the adjacent mobile wireless communications device.

25. The method of claim 24 wherein the at least one RF audio input filter element comprises at least one series connected ferrite bead.

26. The method of claim 24 wherein the at least one RF audio input filter element comprises at least one parallel connected capacitor.

27. The method of claim 24 wherein the frequency range of the adjacent mobile wireless communications device is in a range of 30 MHz to 6 GHz.

28. The method of claim 24 wherein the telephone further comprises a analog to digital converter (ADC) connected to the receive amplifier; and wherein positioning the at least one RF shield comprises positioning the at least one RF shield to also surround the ADC.

* * * * *